US012799624B2

(12) United States Patent

Sekiwa et al.

(10) Patent No.: US 12,799,624 B2
(45) Date of Patent: Nov. 17, 2026

(54) METHOD FOR PRODUCING β-GA2O3/β-GA2O3 MULTILAYER BODY

(71) Applicant: MITSUBISHI GAS CHEMICAL COMPANY, INC., Tokyo (JP)

(72) Inventors: Hideyuki Sekiwa, Tokyo (JP); Hiroaki Tadokoro, Tokyo (JP)

(73) Assignee: MITSUBISHI GAS CHEMICAL COMPANY, INC., Tokyo (JP)

(*) Notice: Subject to any disclaimer, the term of this patent is extended or adjusted under 35 U.S.C. 154(b) by 57 days.

(21) Appl. No.: 18/703,762

(22) PCT Filed: Oct. 28, 2022

(86) PCT No.: PCT/JP2022/040309
§ 371 (c)(1),
(2) Date: Apr. 23, 2024

(87) PCT Pub. No.: WO2023/074836
PCT Pub. Date: May 4, 2023

(65) Prior Publication Data

US 2024/0417881 A1 Dec. 19, 2024

(30) Foreign Application Priority Data

Nov. 1, 2021 (JP) ................................ 2021-178650

(51) Int. Cl.
*C30B 19/12* (2006.01)

(52) U.S. Cl.
CPC .................................. *C30B 19/12* (2013.01)

(58) Field of Classification Search
CPC ... C30B 19/12; C30B 29/16; H01L 21/02175; H01L 21/02227; Y02P 70/50
See application file for complete search history.

(56) References Cited

U.S. PATENT DOCUMENTS

2009/0044745 A1 2/2009 Sekiwa et al.
2014/0306237 A1* 10/2014 Ichinose ............ H01L 33/0025 257/76

(Continued)

FOREIGN PATENT DOCUMENTS

JP 2010-280533 A 12/2010
JP 2014-15366 A 1/2014

(Continued)

OTHER PUBLICATIONS

Li et al., Vacuum 178 (2020) 109440 (Year: 2020).*

(Continued)

*Primary Examiner* — Hua Qi
(74) *Attorney, Agent, or Firm* — GREENBLUM & BERNSTEIN, P.L.C.

(57) ABSTRACT

A method for producing a β-$Ga_2O_3$/β-$Ga_2O_3$ multilayer body, wherein a β-$Ga_2O_3$/β-$Ga_2O_3$ multilayer body is obtained by mixing and melting $Ga_2O_3$, which serves as a solute, and PbO and $Bi_2O_3$, which serve as solvents, and subsequently bringing a β-$Ga_2O_3$ substrate into direct contact with the thus-obtained melt, thereby growing a β-$Ga_2O_3$ single crystal on the β-$Ga_2O_3$ substrate by liquid-phase epitaxial growth.

3 Claims, 4 Drawing Sheets

(56) References Cited

U.S. PATENT DOCUMENTS

| | | | |
|---|---|---|---|
| 2015/0380500 | A1 | 12/2015 | Masui et al. |
| 2020/0243332 | A1 | 7/2020 | Goto et al. |

FOREIGN PATENT DOCUMENTS

| | | | | |
|---|---|---|---|---|
| JP | 2014015366 | A | * | 1/2014 |
| JP | 5794955 | B2 | | 10/2015 |
| JP | 2017-109902 | A | | 6/2017 |
| JP | 2019-182744 | A | | 10/2019 |
| JP | 6744523 | B2 | | 8/2020 |
| KR | 10-2008-0093144 | A | | 10/2008 |

OTHER PUBLICATIONS

Garton et al., "Crystal Growth From the Flux Systems PbO-V2O5 and Bi2O3-V2O5, "Journal of Crystal Growth, 13/14, 1972, 588-592 (Year: 1972).*

Choi et al., "EXAFS spectroscopic study of PbO±Bi2O3±Ga2O3 glasses," Journal of Non-Crystalline Solids 259 (1999) 205-211 (Year: 1999).*

OA for KR App. No. 10-2024-7008343, dated Aug. 20, 2024 (w/ translation).

ISR for PCT/JP2022/040309, dated Jan. 17, 2023 (w/ translation).

Written Opinion of the ISA for PCT/JP2022/040309, dated Jan. 17, 2023 (w/ translation).

Oshima et al., "HVPE of β-$Ga_2O_3$ on Foreign Substrates", Journal of the Japanese Association for Crystal Growth, 42(2):141-147 (2015) [w/ English Abstract].

Yokoyama, "1.3.1 (1) Lead Compounds and Bismuth", Hokkaido University Collection of Scholarly and Academic Papers, pp. 8-14 (1993) [cited in ISR, Written Opinion].

EESR for EP App. No. 22887161.2, dated Nov. 5, 2024.

Murakami et al., "Homoepitaxial growth of β-$Ga_2O_3$ layers by halide vapor phase epitaxy," Applied Physics Express, 8:015503 (4 pp.), (2014).

Galazka, "β-$Ga_2O_3$ for wide-bandgap electronics and optoelectronics," Semiconductor Science Technology, 33(11):113001 (61 pp.), (2018).

Office Action for EP App. No. 22887161.2, dated Jun. 27, 2025.

Mahadik et al., "High-resolution dislocation imaging and microstructural analysis of HVPE-β$Ga_2O_3$ films using monochromatic synchrotron topography", APL Materials, 7, 022513 (2019).

D. Gogova et al., "Homo- and heteroepitaxial growth of Sn-doped $Ga_2O_3$ layers by MOVPE",. CrystEngComm, Aug. 3, 2015, vol. 17, pp. 6744-6752.

* cited by examiner

[Figure 1]
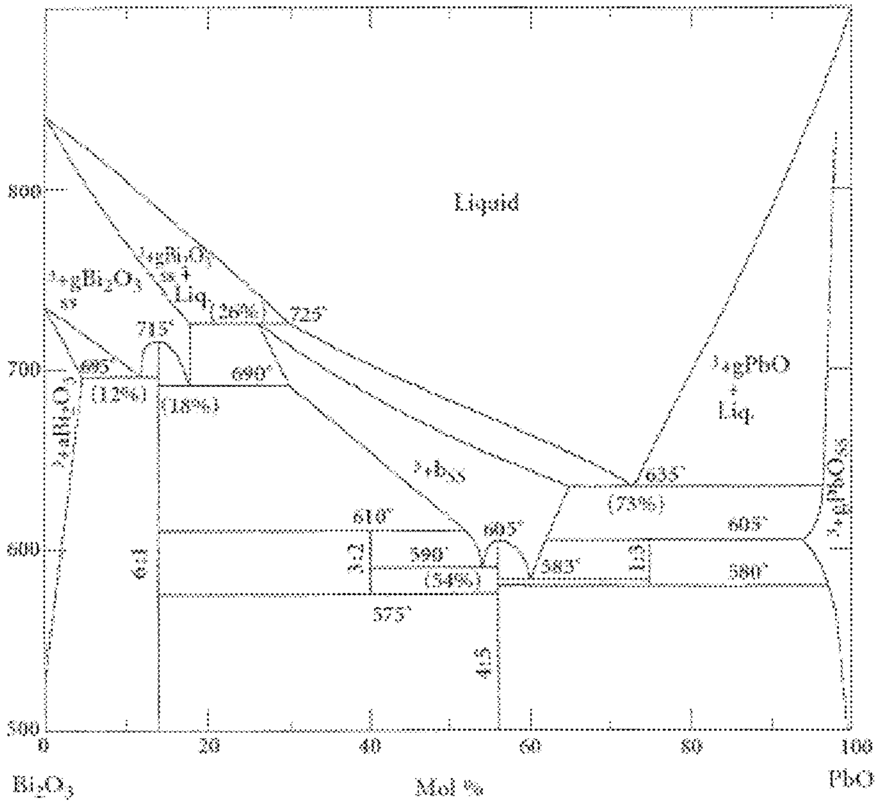
RELATED ART

[Figure 2]
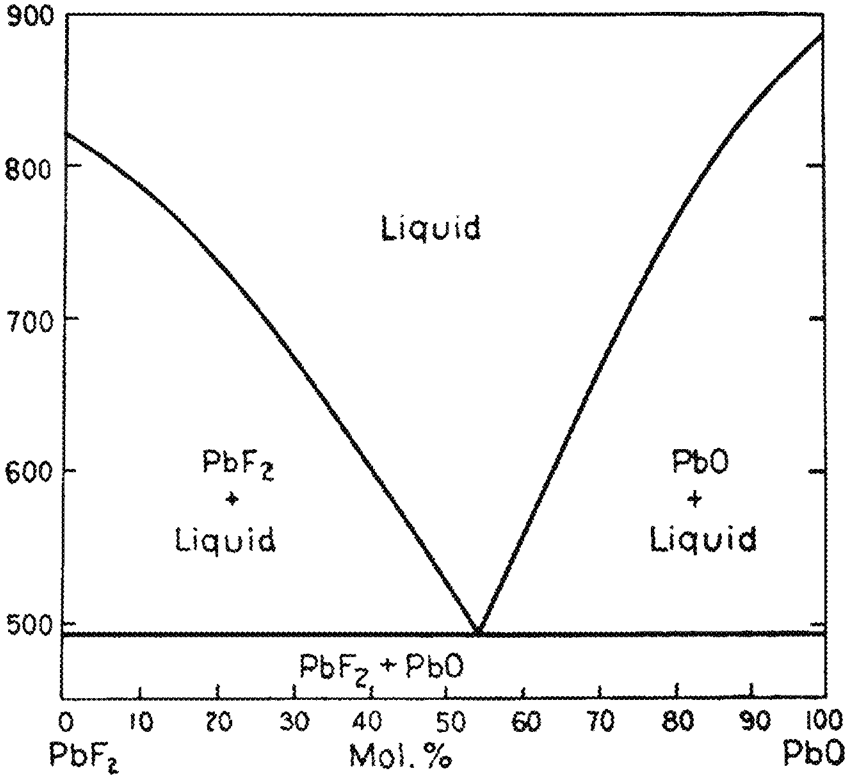
RELATED ART

[Figure 3]
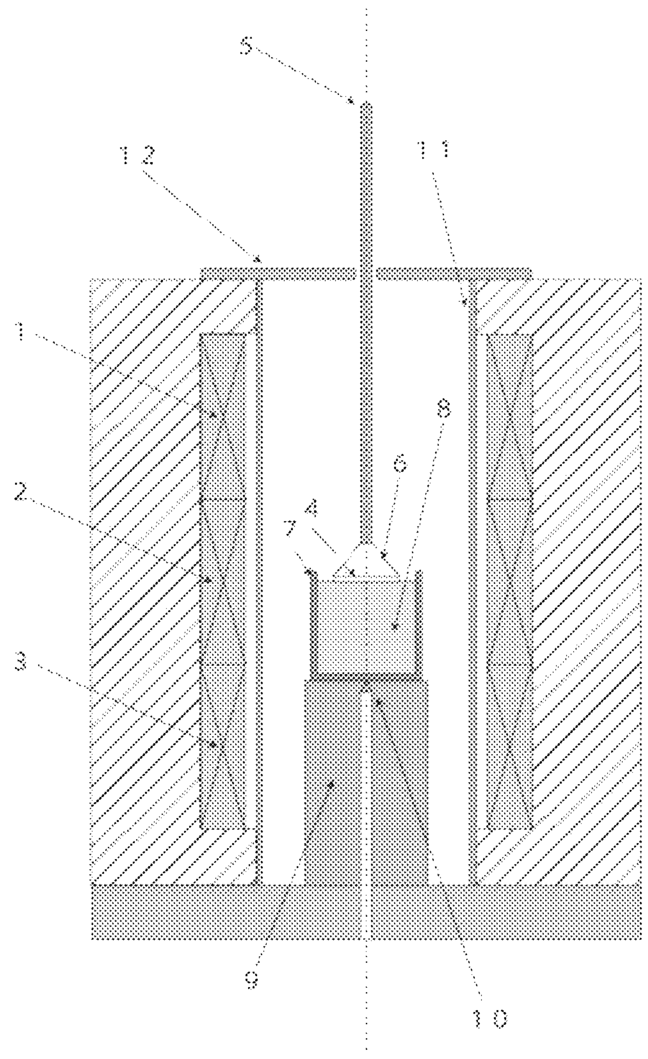

[Figure 4]
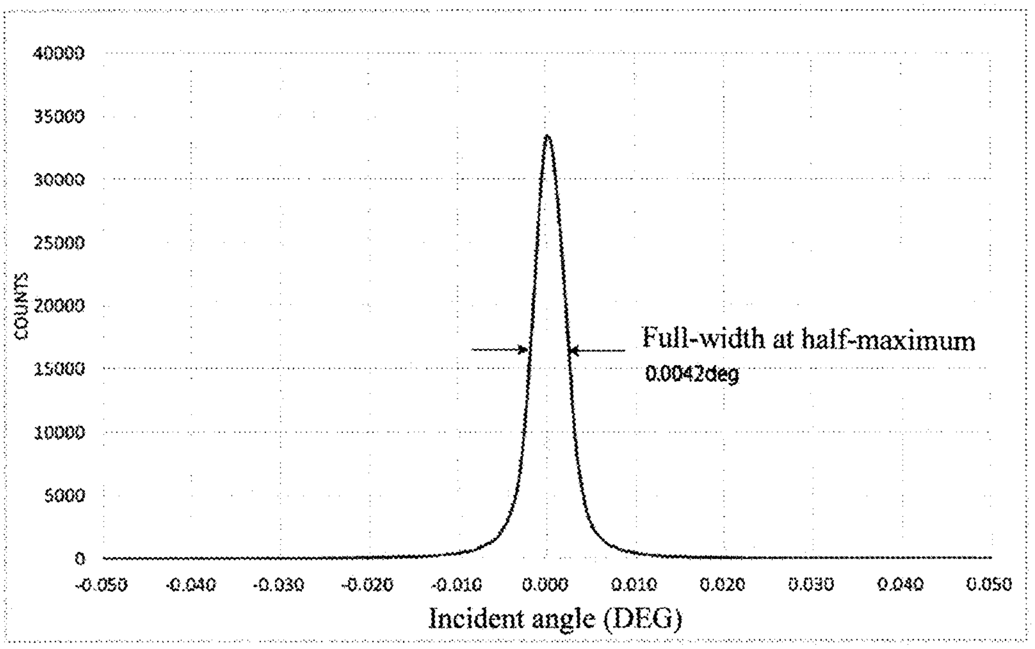

METHOD FOR PRODUCING β-GA2O3/β-GA2O3 MULTILAYER BODY

TECHNICAL FIELD

The present invention relates to a method for producing a β-$Ga_2O_3$/β-$Ga_2O_3$ multilayer body and a multilayer body obtained by said method.

BACKGROUND ART

Power devices are one of the key devices for improving power usage efficiency to realize a low-carbon society, and are mainly used as elements to configure inverters that convert DC-AC power and adjust AC voltage and frequency. Upon the above-mentioned conversion, energy loss due to the resistance when current flows through the element and generation of wasted current due to the recovery process of charge distribution in the element, which occurs at the moment when the voltage applied to the element is switched, are inevitable. These loss percentages vary with power and frequency, but generally range from a few percent to about a dozen percent. Element structures of conventional Si-based power semiconductors have been devised but further improvement of efficiency is becoming difficult because Si is approaching its physical property limit. Therefore, SiC and GaN are being developed as alternative power device materials to Si. SiC and GaN have band gaps of 3.3 eV and 3.4 eV, respectively, and they are materials having wider band gaps than the band gap of Si (i.e., 1.1 eV). The wider the band gap of a material, the higher the breakdown voltage, which represents the electric field at the boundary where charge is prevented from flowing into the semiconductor (avalanche breakdown), and thus the material can provide a device structure that can withstand higher voltages.

β-$Ga_2O_3$ is a kind of oxide semiconductor that has been adopted to transparent conductive substrates for GaN-based LEDs, solar-blind UV detectors, etc. Recently, it has attracted attention as a material for power devices and is expected to realize high-voltage and high-efficiency power semiconductors that surpass SiC and GaN. This is due to the fact that the band gap of β-$Ga_2O_3$ is expected to be 4.5-4.9 eV, which is wider than those of SiC and GaN. Another advantage of β-$Ga_2O_3$ over SiC and GaN is that it allows growing a crystal from a melt. SiC and GaN have difficulty in growing a crystal from a melt, and have an issue that their substrates are expensive. On the other hand, β-$Ga_2O_3$ has a melting point at normal pressure, allows bulk crystal growth, and its study and development are progressing through the EFG (Edge-Defined Film-fed Growth) method and the vertical Bridgman method. The former growth method has provided commercially available 2- to 4-inch substrates, and the latter is used for the development of 4-inch substrates.

In order to apply β-$Ga_2O_3$ to power devices, a β-$Ga_2O_3$ (epitaxial layer)/β-$Ga_2O_3$ (substrate) multilayer body consisting of two layers of β-$Ga_2O_3$ with different residual electron densities is required. The thickness of the epitaxial layer needs to be around several μm to 20 μm, and vapor-phase growth methods such as metal organic chemical vapor deposition (MOCVD), molecular beam epitaxy (MBE), mist CVD, and halide vapor-phase epitaxy (HVPE) have traditionally been used. However, the vapor-phase growth method is a non-thermodynamic growth method and has the disadvantages of poor crystal quality and slow growth rate.

For example, Non-patent literature 1 discloses a method of epitaxial growth of β-$Ga_2O_3$ on a sapphire substrate by the HVPE method. According to this method, the sapphire substrate and β-$Ga_2O_3$ have different crystal structures, resulting in multiple rotational domains and an epitaxial layer that is not composed of a single domain. This layer is not strictly a single crystal and cannot be used for power devices. The full width at half maximum of the X-ray rocking curve of the epitaxial layer obtained by the same method is as high as 0.5 deg (1,800 arcsec), indicating low crystallinity. Patent literature 1 also discloses a method of epitaxial growth of β-$Ga_2O_3$ on a β-$Ga_2O_3$ substrate by the HVPE method to obtain a β-$Ga_2O_3$/β-$Ga_2O_3$ multilayer body (hereinafter simply referred to as a "β-$Ga_2O_3$ multilayer body"). Although a β-$Ga_2O_3$/β-$Ga_2O_3$ multilayer body can be obtained by this method, the growth rate of the epitaxial layer is as low as 2.7-6.0 μm/hr.

On the other hand, the liquid-phase growth method has the advantage of producing a high-quality crystal more easily than the vapor-phase growth method because crystal growth proceeds in principle in thermal equilibrium. The melting point of β-$Ga_2O_3$ is as high as 1970° C., and it is difficult to maintain a stable melt surface near the melting point, making it difficult to grow β-$Ga_2O_3$ by the Czochralski method, which is employed for single-crystal silicon and the like. Therefore, a single crystal is grown by the above-mentioned EFG method or vertical Bridgman method. However, a β-$Ga_2O_3$ multilayer body cannot be obtained by the EFG or the vertical Bridgman method. Examples of a method in which a target substance is dissolved in a suitable solvent, the temperature of the mixed solution is lowered to a supersaturated state, and the target substance is grown from the melt include the static slow-cooling method, the flux method, the floating zone method, the top seeded solution growth (TSSG) method, the solution pulling method, and the liquid-phase epitaxy (LPE) method.

Patent literature 2 discloses a method for obtaining a β-$Ga_2O_3$ epitaxial layer by the LPE method. According to this method, a β-$Ga_2O_3$ single-crystal layer is stacked on a sapphire substrate by the LPE method, and a β-$Ga_2O_3$ multilayer body cannot be obtained because the substrate is made of sapphire. Moreover, the crystal structure of the sapphire substrate is corundum, while the crystal structure of β-$Ga_2O_3$ is monoclinic, and so they have different crystal structures. In addition, there is a problem of poor crystal quality due to inconsistent lattice constants.

When a β-$Ga_2O_3$ single-crystal layer is grown by the liquid-phase growth method such as the LPE method, a solvent capable of dissolving β-$Ga_2O_3$ is required. In Patent literature 2, PbO and $PbF_2$ are exemplified as solvents, and either one of them is used. In order to establish a stable and well reproducible single-crystal growth method, it is common practice to keep the melt at a temperature about 100-200° C. above its melting point so that the solvent and solute are mixed homogeneously. In Patent literature 2, the melt is maintained at 1100° C. The melting points of PbO and $PbF_2$ are about 886° C. and 824° C., respectively. In general, when the temperature of the melt containing either PbO or $PbF_2$ exceeds 1000° C., some of PbO or $PbF_2$ volatilizes and the composition of the melt changes, which is not favorable for growing a β-$Ga_2O_3$ single crystal in a stable and well reproducible manner. In addition, since the vaporized PbO or $PbF_2$ reacts with the furnace material constituting the crystal growing furnace, the number of times the furnace material can be used is reduced and toxic Pb is volatilized, which increase the cost because the crystal growing furnace needs to have a closed structure or the like.

As described above, as a method for obtaining a β-$Ga_2O_3$ multilayer body that is useful for power devices, methods employing vapor-phase growth of β-$Ga_2O_3$ on a β-$Ga_2O_3$ substrate have the disadvantages of poor crystal quality and slow growth rate. Alternatively, when a liquid-phase growth method is used, which in principle is close to thermal equilibrium growth and which is expected to result in high crystallinity and high growth rate, there is a problem where a β-$Ga_2O_3$ multilayer body cannot be obtained by a conventional method. In addition, use of either PbO or $PbF_2$ as a solvent and the high vapor pressure of the conventional liquid-phase growth method make it difficult to grow a β-$Ga_2O_3$ single crystal in a stable and cost-effective manner.

CITATION LIST

Patent Literature

Patent literature 1: Japanese Patent No. 6744523
Patent literature 2: Japanese Patent No. 5794955

Non-Patent Literature

Non-patent literature 1: Journal of the Japanese Association for Crystal Growth, Vol. 42, No. 2, (2015), pp. 141-147

SUMMARY OF INVENTION

Technical Problem

The present invention has an objective of solving at least one of the above-described conventional problems. Further, the present invention has an objective of providing a method for producing a β-$Ga_2O_3$/β-$Ga_2O_3$ multilayer body by stacking a β-$Ga_2O_3$ single crystal having high crystallinity and fast growth rate on a β-$Ga_2O_3$ substrate by a liquid-phase epitaxial growth method.

Herein, a β-$Ga_2O_3$/β-$Ga_2O_3$ multilayer body refers to a multilayer body in which an epitaxial layer containing β-$Ga_2O_3$ is stacked on a substrate containing β-$Ga_2O_3$.

Solution to Problem

The present inventors have diligently studied to solve the above problems and found that the above problems can be solved by the following invention. Accordingly, the present invention is as follows.

<1> A method for producing a β-$Ga_2O_3$/β-$Ga_2O_3$ multilayer body, the method comprising mixing and melting $Ga_2O_3$ as a solute and PbO and $Bi_2O_3$ as solvents, then bringing a D-$Ga_2O_3$ substrate into direct contact with the resulting melt, and allowing a β-$Ga_2O_3$ single crystal to grow on the β-$Ga_2O_3$ substrate by a liquid-phase epitaxial growth method, thereby obtaining the β-$Ga_2O_3$/β-$Ga_2O_3$ multilayer body.

<2> The method for producing a β-$Ga_2O_3$/β-$Ga_2O_3$ multilayer body according to <1> above, wherein the mixing ratio of $Ga_2O_3$ as the solute to PbO and $Bi_2O_3$ as the solvents is solute: solvents=5-30 mol %: 95-70 mol %, and the mixing ratio of the solvents, PbO and $Bi_2O_3$, is PbO: $Bi_2O_3$=0.1-95 mol %: 99.9-5 mol %.

<3> A method for producing a β-$Ga_2O_3$/β-$Ga_2O_3$ multilayer body, the method comprising mixing and melting $Ga_2O_3$ as a solute and PbO and $PbF_2$ as solvents, then bringing a D-$Ga_2O_3$ substrate into direct contact with the resulting melt, and allowing a β-$Ga_2O_3$ single crystal to grow on the β-$Ga_2O_3$ substrate by a liquid-phase epitaxial growth method, thereby obtaining the β-$Ga_2O_3$/β-$Ga_2O_3$ multilayer body.

<4> The method for producing a β-$Ga_2O_3$/β-$Ga_2O_3$ multilayer body according to <3> above, wherein the mixing ratio of $Ga_2O_3$ as the solute to PbO and $PbF_2$ as the solvents is solute: solvents=2-20 mol %: 98-80 mol %, and the mixing ratio of the solvents, PbO and $PbF_2$, is PbO:$PbF_2$=2-80 mol %: 98-20 mol %.

<5> The method for producing a β-$Ga_2O_3$/β-$Ga_2O_3$ multilayer body according to any one of <1> to <4> above, wherein the layer containing the β-$Ga_2O_3$ single crystal formed by the liquid-phase epitaxial growth method comprises foreign elements in total amount of 0.01 mol % or more but 20 mol % or less.

<6> The method for producing a β-$Ga_2O_3$/β-$Ga_2O_3$ multilayer body according to <5> above, wherein the foreign element is one or more selected from the group consisting of Be, Mg, Ca, Sr, Ba, Ti, Zr, Hf, Fe, Co, Ni, Cu, Zn, Cd, Al, In, Si, Ge, Sn, and Pb.

<7> A β-$Ga_2O_3$/β-$Ga_2O_3$ multilayer body comprising a layer containing a β-$Ga_2O_3$ single crystal on a β-$Ga_2O_3$ substrate, wherein the full width at half maximum of the rocking curve of the layer containing the β-$Ga_2O_3$ single crystal is 5-100 arcsec.

Advantageous Effects of Invention

According to a preferred embodiment of the present invention, evaporation of the solvent is suppressed, and stable crystal growth with minimal composition fluctuation can be achieved. Moreover, the consumption of furnace materials is reduced, and it is not necessary for the growth furnace to be a closed system, thereby enabling manufacturing at a lower cost. In addition, since the liquid-phase growth method is used as the crystal growth method, a β-$Ga_2O_3$ single-crystal layer can be grown with high crystallinity at a high growth rate. The β-$Ga_2O_3$ multilayer body produced by this embodiment can be used for power devices using β-$Ga_2O_3$ multilayer bodies that are expected to be developed in the future.

BRIEF DESCRIPTION OF DRAWINGS

FIG. 1 shows a phase diagram of PbO—$Bi_2O_3$.

FIG. 2 shows a phase diagram of PbO—$PbF_2$.

FIG. 3 shows a schematic diagram of one typical LPE growing furnace.

FIG. 4 shows a X-ray rocking curve of the (002) plane of the epitaxial layer of the multilayer body obtained in Example 1.

DESCRIPTION OF EMBODIMENTS

A first embodiment of the present invention is a method for producing a β-$Ga_2O_3$/β-$Ga_2O_3$ multilayer body, the method comprising mixing and melting $Ga_2O_3$ as a solute and PbO and $Bi_2O_3$ as solvents, then bringing a β-$Ga_2O_3$ substrate into direct contact with the resulting melt, and allowing a β-$Ga_2O_3$ single crystal to grow on the β-$Ga_2O_3$ substrate by a liquid-phase epitaxial growth method, thereby obtaining the β-$Ga_2O_3$/β-$Ga_2O_3$ multilayer body.

Hereinafter, the principle of the first embodiment of the present invention will be described.

FIG. 1 shows a phase diagram of PbO—$Bi_2O_3$(Source: Temperature/combination phase diagram of the system $Bi_2O_3$—PbO, J. Am. Chem. Soc., 64[3], 182-184, 1981). PbO and $Bi_2O_3$ form a eutectic system, and they can be mixed to lower the melting point. By mixing PbO and $Bi_2O_3$ to give the PbO concentration in the range of 0.1-95 mol %, the melting point of the PbO+$Bi_2O_3$ mixture can be reduced to be lower than or equal to the melting point of PbO alone or $Bi_2O_3$ alone. This indicates that the amount of vaporization of PbO or $Bi_2O_3$ in the above PbO concentration range can be suppressed compared to that of PbO or $Bi_2O_3$ alone.

The solvent composition is preferably PbO: $Bi_2O_3$=0.1-95 mol %: 99.9-5 mol %. More preferably, the solvent composition is PbO: $Bi_2O_3$=20-90 mol %: 80-10 mol %, and particularly preferably PbO: $Bi_2O_3$=50-80 mol %: 50-20 mol %. Since the LPE growth temperature (temperature at the time of epitaxial growth) is higher when PbO or $Bi_2O_3$ alone is used as the solvent, a mixed solvent such as the one mentioned above is favorable.

The mixing ratio of $Ga_2O_3$ as the solute and PbO and $Bi_2O_3$ as the solvents is preferably solute: solvents=5-30 mol %: 95-70 mol %. More preferably, the solute concentration is 14 mol % or more but 27 mol % or less. Solute concentrations lower than 5 mol % may result in a slow crystal growth rate while solute concentrations higher than 30 mol % may result in a high LPE growth temperature and increased solvent volatilization. It may also result in a faster crystal growth rate and poor crystal quality.

In the first embodiment of the present invention, the growth rate of the layer containing a β-$Ga_2O_3$ single crystal (epitaxial layer) formed by the liquid-phase epitaxial growth method is preferably 10-50 μm/hr, and more preferably 20-30 μm/hr. Growth rates lower than 10 μm/hr may result in a slow growth rate and increased cost. In addition, growth rates higher than 50 μm may result in poor crystal quality. Here, the growth rate can be obtained from the difference in film thickness before and after LPE growth and the growth time.

Next, a second embodiment of the present invention is a method for producing a β-$Ga_2O_3$/β-$Ga_2O_3$ multilayer body, the method comprising mixing and melting $Ga_2O_3$ as a solute and PbO and $PbF_2$ as solvents, then bringing a β-$Ga_2O_3$ substrate into direct contact with the resulting melt, and allowing a β-$Ga_2O_3$ single crystal to grow on the β-$Ga_2O_3$ substrate by a liquid-phase epitaxial growth method, thereby obtaining the β-$Ga_2O_3$/β-$Ga_2O_3$ multilayer body.

The principle of the second embodiment of the present invention will be described.

FIG. 2 shows a phase diagram of PbO—$PbF_2$ (Source: C. Sandonnini Atti, Accad. Naz. Licei, C1. *Sci. Fis. Mat. Nat.,* 23[Ser.5, Pt.1], 962-964 (1914)). PbO and $PbF_2$ form a eutectic system, and they can be mixed to lower the melting point. By mixing PbO with $PbF_2$ to give the $PbF_2$ concentration in the range of about 0.01-86 mol %, the melting point of the PbO+$PbF_2$ mixture can be reduced to be lower than or equal to the melting point of PbO alone or $PbF_2$ alone. This indicates that the amount of vaporization of PbO or $PbF_2$ in the above PbO+$PbF_2$ concentration range can be suppressed compared to that of PbO or $PbF_2$ alone.

The solvent composition is preferably PbO:$PbF_2$=2-80 mol %: 98-20 mol %. More preferably, the solvent composition is PbO:$PbF_2$=20-80 mol %: 80-20 mol %, and particularly preferably PbO:$PbF_2$=40-60 mol %: 60-40 mol %. Since the LPE growth temperature is higher when PbO or $PbF_2$ alone is used as the solvent, a mixed solvent such as the one mentioned above is favorable.

The mixing ratio of $Ga_2O_3$ as the solute and PbO and $PbF_2$ as the solvents is preferably solute: solvents=2-20 mol %: 98-80 mol %. More preferably, the solute concentration is 10 mol % or more but 20 mol % or less. Solute concentrations lower than 2 mol % may result in a slow growth rate while solute concentrations higher than 20 mol % may result in a high LPE growth temperature and increased solvent volatilization. It may also result in a faster crystal growth rate and poor crystal quality.

In the second embodiment of the present invention, the growth rate of the layer containing a β-$Ga_2O_3$ single crystal (epitaxial layer) formed by the liquid-phase epitaxial growth method is preferably 10-50 μm/hr, and more preferably 20-30 μm/hr. Growth rates lower than 10 μm/hr may result in a slow growth rate and increased cost. In addition, growth rates higher than 50 μm may result in poor crystal quality. Here, the growth rate can be obtained from the difference in film thickness before and after LPE growth and the growth time.

In the first and second embodiments of the present invention, for the purposes of controlling the LPE growth temperature, adjusting the solvent viscosity, and doping foreign elements, one or more third components can be added to the solvent to the extent that the solubility of $Ga_2O_3$ and the amount of PbO+$Bi_2O_3$ or PbO+$PbF_2$ vaporization are not significantly changed. Examples of the third component include $B_2O_3$, $V_2O_5$, $P_2O_5$, $MoO_3$, and $WO_3$. $Bi_2O_3$ may also be added as a third component to the solvent of the second embodiment.

The most preferred growth method for a β-$Ga_2O_3$ multilayer body according to the present invention is a liquid-phase epitaxial growth method using a β-$Ga_2O_3$ substrate.

In a β-$Ga_2O_3$ multilayer body useful as a power device, the residual electron density in the epitaxial layer needs to be controlled. Ga in β-$Ga_2O_3$ is a trivalent oxide and generally exhibits n-type conductivity. In the first and second embodiments of the present invention, the residual electron density, band gap, insulating property, etc. can be imparted by doping a foreign element into β-$Ga_2O_3$. For example, doping divalent impurities MgO or ZnO into β-$Ga_2O_3$ can reduce the residual electrons. On the other hand, the residual electron density can be increased by doping tetravalent impurities $SiO_2$ or $SnO_2$. In addition, $Fe_2O_3$ doping can provide an insulating property. Meanwhile, the band gap can be increased by doping MgO or $Al_2O_3$, which has a wider band gap than β-$Ga_2O_3$, to obtain a mixed crystal. On the other hand, the band gap can be reduced by doping ZnO or CdO to obtain a mixed crystal.

A layer containing the β-$Ga_2O_3$ single crystal formed by the liquid-phase epitaxial growth method contains, one or more foreign elements selected from the group consisting of Be, Mg, Ca, Sr, Ba, Ti, Zr, Hf, Fe, Co, Ni, Cu, Zn, Cd, Al, In, Si, Ge, Sn, and Pb, preferably in the range of 0.01-20 mol %, more preferably in the range of 0.1-10 mol %. Doping amounts of foreign elements less than 0.01 mol % may result in poor properties, and doping amounts greater than 20 mol % may cause difficulties in crystal growth.

FIG. 3 shows a schematic diagram of a typical LPE growing furnace. Inside the LPE growing furnace, a platinum crucible 7, in which raw materials are melted and stored as a melt 8, is placed on a crucible stand 9 made of mullite (a compound of aluminum oxide and silicon dioxide). Three-stage side heaters (upper heater 1, middle heater 2, and lower heater 3) that heat and melt the raw materials in the platinum crucible 7 are provided outside and to the side of the platinum crucible 7. The heater outputs are independently controlled, and the amount of heat applied to the melt 8 is independently adjusted. A mullite furnace core tube 11 is placed between the heaters and the inner wall of the production furnace, and a mullite furnace lid 12 is placed above the furnace core tube 11. A pull-up mechanism is provided above the platinum crucible 7. An alumina growing shaft 5 is secured to the pull-up mechanism, and a substrate holder 6 and a substrate 4 secured by the holder are provided at one end of the shaft. A mechanism for rotating the shaft is provided at the top of the growing shaft 5. In addition, a thermocouple 10 is provided at the bottom of the crucible.

A third embodiment of the present invention is a β-$Ga_2O_3$/β-$Ga_2O_3$ multilayer body having a layer containing a β-$Ga_2O_3$ single crystal on a β-$Ga_2O_3$ substrate, wherein the full width at half maximum of the rocking curve of the layer containing the β-$Ga_2O_3$ single crystal is 5-100 arcsec.

The above-described β-$Ga_2O_3$/β-$Ga_2O_3$ multilayer body of the present invention can favorably be produced by the first and second embodiments of the present invention described above.

According to the present invention, the full width at half maximum of the rocking curve of the layer containing the β-$Ga_2O_3$ single crystal is 5-100 arcsec, preferably 5-80 arcsec, and more preferably 5-50 arcsec. The full width at half maximum above 100 arcsec may result in low crystallinity and performance of the power device may be degraded. The β-$Ga_2O_3$/β-$Ga_2O_3$ multilayer body of the present invention is characterized by its high crystallinity. In the present invention, the method described in the examples described below can be adopted as the method for measuring a full width at half maximum of a rocking curve.

EXAMPLES

Hereinafter, a method of depositing a β-$Ga_2O_3$ epitaxial layer on a β-$Ga_2O_3$ substrate will be described as a method for growing a β-$Ga_2O_3$/β-$Ga_2O_3$ multilayer body according to one embodiment of the present invention. The present invention should not be limited in any way to the following examples.

Hereinafter, an exemplary production method of the present invention will be described with reference to FIG. 3.

A platinum crucible 7, in which raw materials are melted and stored as a melt 8, is placed on a crucible stand 9. Three-stage side heaters (upper heater 1, middle heater 2, and lower heater 3) that heat and melt the raw materials in the platinum crucible 7 are provided outside and to the side of the platinum crucible 7. The heater outputs are independently controlled, and the amount of heat applied to the melt 8 is independently adjusted. A furnace core tube 11 is placed between the heaters and the inner wall of the production furnace, and a furnace lid 12 is placed above the furnace core tube 11. A pull-up mechanism is provided above the platinum crucible 7. An alumina growing shaft 5 is secured to the pull-up mechanism, and a substrate holder 6 and a substrate 4 (β-$Ga_2O_3$ substrate) secured by the holder are provided at one end of the shaft. A mechanism for rotating the shaft is provided at the top of the growing shaft 5. In addition, a thermocouple 10 is provided at the bottom of the crucible.

In order to melt the raw materials in the platinum crucible 7, the production furnace is heated until the raw materials are melted. Preferably, the temperature is raised to 600-1000° C., more preferably to 700-900° C., and the raw material melt is allowed to stand for 2-3 hours to homogenize. Instead of leaving it stationary, a platinum plate attached to one end of the alumina shaft can be immersed in the melt to stir and homogenize the melt by rotating the shaft. It is desirable to allow a β-$Ga_2O_3$ single-crystal layer to grow only directly below the substrate. If the growth of the β-$Ga_2O_3$ single crystal occurs in the melt where it is not directly below the substrate, the grown single crystal will adhere to the substrate by convection currents in the melt, resulting in phases with different growth orientations, which is undesirable. Therefore, a temperature gradient is applied to the three-stage heaters so that the temperature of the crucible bottom is a few degrees higher than that of the melt surface. After the temperature of the melt has stabilized, a seed crystal substrate is brought into contact with the melt surface. After the seed crystal substrate comes into uniform contact with the melt, the temperature is kept constant, or the temperature is lowered at a rate of 0.025-5° C./hr, to allow a β-$Ga_2O_3$ single-crystal layer of interest to grow on the surface of the seed crystal substrate. During the growth, the seed crystal substrate is rotated at 5-300 rpm by the rotation of the growing shaft, and the rotation direction is reversed at regular intervals. After allowing a crystal to grow for about 30 minutes to 24 hours, the growing shaft is lifted to separate the grown crystal from the melt, and the melt attached to the surface of the grown crystal is removed by rotating the growing shaft at 50 to 300 rpm. The temperature is then allowed to cool to room temperature over a period of 1-24 hours to obtain the desired β-$Ga_2O_3$/$β_2O_3$ multilayer body.

Example 1

A platinum crucible 7 with inner diameter of 120 mm, height of 150 mm, and thickness of 1 mm was filled with 2661.2 g of PbO (purity: 99.999%), 2777.7 g of $Bi_2O_3$ (purity: 99.999%), and 561.2 g of $Ga_2O_3$ (purity: 99.999%) as raw materials. The mixing ratio of $Ga_2O_3$ as the solute to PbO and $Bi_2O_3$ as the solvents was solute: solvents=14.3 mol %: 85.7 mol %, and the mixing ratio of the solvents, PbO and $Bi_2O_3$, was PbO: $Bi_2O_3$-67 mol %: 33 mol %. The platinum crucible 7 fed with the raw materials was placed in a LPE furnace shown in FIG. 3, and the temperature at the bottom of the crucible was set at about 850° C. to melt the raw materials. After stirring the melt using a platinum plate for 6 hours, the temperature was lowered until the temperature at the bottom of the crucible reached 750° C., and a 11 mm×11 mm×650 μm thick, C-plane oriented β-$Ga_2O_3$ substrate grown by the EFG method was brought into contact with it. Growth was allowed to continue for 3 hours at the same temperature while rotating the growing shaft 5 made of alumina at 60 rpm. The rotation direction was reversed every 5 minutes. Thereafter, the substrate was separated from the melt by pulling up the growing shaft 5 and the melt components were removed by rotating the growing shaft 5 at 200 rpm. The temperature was then allowed to cool to room temperature to obtain a β-$Ga_2O_3$/$β_2O_3$ multilayer body. Melt components that could not be removed completely were removed using hydrochloric acid. The average thickness of the epitaxial layer was about 90 μm. The average growth rate was about 30 μm/hr.

Comparative Examples 1-2

Attempts were made to produce β-$Ga_2O_3$/$β_2O_3$ multilayer bodies in the same manner as in Example 1 except that the composition of the feed was changed to give the composition shown in Table 1 below, and the temperature at which the raw materials were melted, and the growth temperature were changed as shown in Table 1.

Here, the crystallinity of the epitaxial layer of the β-$Ga_2O_3$/$β_2O_3$ multilayer body obtained in Example 1 was evaluated by the full width at half maximum of the rocking curve of the (002) plane. The result is shown in FIG. 4. The full width at half maximum of the rocking curve of the (002) plane was 0.0042 deg (=15 arcsec). The full width at half maximum of the rocking curve was measured using an X-ray diffractometer (X'pert MRD from Spectris plc). Using the same apparatus, 2θ, ω, χ, and φ were adjusted for axis alignment that allows detection of the peak of the (002) plane of β-$Ga_2O_3$, and then the measurement was performed with a tube voltage of 45 KV and a tube current of 40 mA. The incident light was monochromatized using Ge(220) planes of four crystals. Other measurement conditions were as follows.

Light source; Cu-Ku
Wavelength; 0.15418 nm
Measurement mode; ω-scan (incident angle scan)
ω range; Angle at which the β-$Ga_2O_3$ (002) plane appears was set for each sample
ω range; 0.1 deg
ω step; 0.0005 deg
2θ position; Angle at which the β-$Ga_2O_3$ (002) plane appears was set for each sample
Collimator diameter; 0.5 mm
Anti-scattering slit; 1.5 mm

Examples 2-8

β-$Ga_2O_3$/β-$Ga_2O_3$ multilayer bodies were obtained in the same manner as in Example 1 except that the composition of the feed was changed to give the composition shown in Table 1 below, and the temperature at which the raw materials were melted and the growth temperature were changed as shown in Table 1. The epitaxial layer obtained in Example 2 was a mixed layer of β-$Ga_2O_3$ and MgO, and the epitaxial layer obtained in Example 5 was a mixed layer of β-$Ga_2O_3$ and $Al_2O_3$.

turing at a lower cost. In addition, as mentioned above, the present invention is a liquid-phase growth method that is close to thermal equilibrium growth. Therefore, as shown in Table 1 above, the growth rate was as fast as 13-30 μm/hr, and the full width at half maximum of the rocking curve was as narrow as 15-28 arcsec, showing high crystallinity. On the other hand, in Comparative examples 1-2, multilayer bodies were not produced because the raw materials did not melt unless the heat applied was higher than 1000° C. and the solvent volatilized at a temperature higher than 1000° C.

Example 9

A platinum crucible 7 with an inner diameter of 120 mm, a height of 150 mm, and a thickness of 1 mm was filled with 1022.3 g of PbO (purity: 99.999%), 4503.7 g of $PbF_2$ (99%), and 476.2 g of β-$Ga_2O_3$ as raw materials. The mixing ratio of $Ga_2O_3$ as the solute to PbO and $PbF_2$ as the solvents was solute: solvents=10.0 mol %: 90 mol %, and the mixing ratio of the solvents, PbO and $PbF_2$, was PbO:$PbF_2$=20 mol %: 80 mol %. The platinum crucible 7 fed with the raw materials was placed in a LPE furnace shown in FIG. 3, and the temperature at the bottom of the crucible was set at about 940° C. to melt the raw materials. After stirring the melt using a platinum plate for 6 hours, the temperature was lowered until the temperature at the bottom of the crucible reached 840° C., and a 11 mm×11 mm×650 μm thick, C-plane oriented β-$Ga_2O_3$ substrate grown by the EFG method was brought into contact with it. Growth was allowed to continue for 3 hours at the same temperature while rotating a growing shaft 5 made of alumina at 60 rpm.

TABLE 1

| | Components in solvent | | Amount of solute | Amount of foreign | Amount of foreign element | Amount of | Temperature at which raw materials | LPE growth | Growth | Full width at half maximum of rocking |
|---|---|---|---|---|---|---|---|---|---|---|
| | PbO (mol %) | $Bi_2O_3$ (mol %) | $Ga_2O_3$ (mol %) | element MgO (mol %) | $Al_2O_3$ (mol %) | solvent (mol %) | were melted (° C.) | temperature (° C.) | rate (μm/hr) | curve (arcsec) |
| Example 1 | 67 | 33 | 14.3 | 0 | 0 | 85.7 | 850 | 750 | 30 | 15 |
| Example 2 | 67 | 33 | 11.4 | 2.9 | 0 | 85.7 | 840 | 740 | 25 | 23 |
| Example 3 | 67 | 33 | 19.8 | 0 | 0 | 80.2 | 980 | 818 | 13 | 15 |
| Example 4 | 67 | 33 | 21 | 0 | 0 | 79 | 980 | 850 | 13 | 16 |
| Example 5 | 67 | 33 | 14.3 | 0 | 2.9 | 82.8 | 980 | 760 | 25 | 28 |
| Example 6 | 80 | 20 | 19.8 | 0 | 0 | 80.2 | 980 | 780 | 15 | — |
| Example 7 | 80 | 20 | 25 | 0 | 0 | 75 | 980 | 910 | 15 | 25 |
| Example 8 | 33 | 67 | 19.8 | 0 | 0 | 80.2 | 980 | 850 | 15 | — |
| Comparative example 1 | 100 | 0 | 14.3 | 0 | 0 | 85.7 | 1,090 | 990 | — | — |
| Comparative example 2 | 0 | 100 | 14.3 | 0 | 0 | 85.7 | 1,030 | 930 | — | — |

As described above, a β-$Ga_2O_3$/β-$Ga_2O_3$ multilayer body can be produced by mixing and melting $Ga_2O_3$ as a solute and PbO and $Bi_2O_3$ as solvents, then bringing a β-$Ga_2O_3$ substrate into direct contact with the resulting melt. As can be appreciated by comparing Examples 1-8 with Comparative examples 1-2, the melting point of the solvent can be lowered by mixing PbO and $Bi_2O_3$ compared to PbO or $Bi_2O_3$ alone. Therefore, both the temperature at which the raw materials were melted and the growth temperature of β-$Ga_2O_3$ were lower than those in the case of using a single solvent. This means that the amount of vaporization of the solvent components can be reduced. According to this method, since evaporation of the solvent is suppressed, stable crystal growth with minimal composition fluctuation can be achieved. Moreover, the consumption of furnace materials is reduced, and it is not necessary for the growth furnace to be a closed system, thereby enabling manufac- The shaft rotation was reversed every 5 minutes. Thereafter, the substrate was separated from the melt by pulling up the growing shaft 5 and the melt components were removed by rotating the growing shaft 5 at 200 rpm. The temperature was then allowed to cool to room temperature to obtain a β-$Ga_2O_3$/β-$Ga_2O_3$ multilayer body. Melt components that could not be removed completely were removed using nitric acid. The average thickness of the epitaxial layer was about 69 μm. The average growth rate was about 23 μm/hr.

Examples 10-11, Comparative Example 3

β-$Ga_2O_3$/β-$Ga_2O_3$ multilayer bodies were obtained in the same manner as in Example 9 except that the composition of the feed was changed to give the composition shown in Table 2 below, and the temperature at which the raw materials were melted and the growth temperature were changed as shown in Table 2.

TABLE 2

| | Components in solvent | | Amount of solute | Amount of solvent | Temperature at which raw materials were melted | LPE growth temperature | Growth rate | Full width at half maximum of rocking curve |
|---|---|---|---|---|---|---|---|---|
| | PbO (mol %) | $PbF_2$ (mol %) | $Ga_2O_3$ (mol %) | (mol %) | (° C.) | (° C.) | (μm/hr) | (arcsec) |
| Example 9 | 20 | 80 | 10 | 90 | 940 | 840 | 23 | 39 |
| Example 10 | 54 | 46 | 10 | 90 | 700 | 600 | 25 | 35 |
| Example 11 | 80 | 20 | 10 | 90 | 950 | 850 | 18 | 43 |
| Comparative example 3 | 0 | 100 | 10 | 90 | 1,030 | 930 | — | — |

Examples 12-13

β-$Ga_2O_3$/β-$Ga_2O_3$ multilayer bodies were obtained in the same manner as in Example 9 except that the composition of the feed was changed to give the composition shown in Table 3 below, and the temperature at which the raw materials were melted and the growth temperature were changed as shown in Table 3. If the concentration of $Ga_2O_3$ as the solute is lower than 2 mol %, the melting point becomes closer to the melting point of the solvent, and stable crystal growth may be difficult due to the viscosity of the solvent. Moreover, a solute concentration higher than 20 mol % may result in a high growth temperature. Therefore, the concentration of $Ga_2O_3$ as the solute is preferably 2-20 mol %.

TABLE 3

| | Components in solvent | | Amount of solute | Amount of solvent | Temperature at which raw materials were melted | LPE growth temperature | Growth rate | Full width at half maximum of rocking curve |
|---|---|---|---|---|---|---|---|---|
| | PbO (mol %) | $PbF_2$ (mol %) | $Ga_2O_3$ (mol %) | (mol %) | (° C.) | (° C.) | (μm/hr) | (arcsec) |
| Example 12 | 54 | 46 | 2 | 98 | 680 | 580 | 20 | 77 |
| Example 13 | 54 | 46 | 20 | 80 | 930 | 830 | 29 | 76 |

As described above, a β-$Ga_2O_3$/$β_2O_3$ multilayer body can be produced by mixing and melting $Ga_2O_3$ as a solute and PbO and $PbF_2$ as solvents, then bringing a β-$Ga_2O_3$ substrate into direct contact with the resulting melt. As can be appreciated by comparing Examples 9-13 with Comparative examples 1 and 3, the melting point of the solvent can be lowered by mixing PbO and $PbF_2$ compared to PbO or $PbF_2$ alone. Therefore, both the temperature at which the raw materials were melted and the growth temperature of β-$Ga_2O_3$ were lower than those in the case of using a single solvent. This means that the amount of vaporization of the solvent components can be reduced. According to this method, since the amount of evaporation of the solvent is suppressed, stable crystal growth with minimal composition fluctuation can be achieved. Moreover, the consumption of furnace materials is reduced, and it is not necessary for the growth furnace to be a closed system, thereby enabling manufacturing at a lower cost. In addition, as mentioned above, the present invention is a liquid-phase growth method that is close to thermal equilibrium growth. Therefore, as shown in Tables 2 and 3 above, the growth rate was as fast as 18-29 μm/hr, and the full width at half maximum of the rocking curve was as narrow as 35-77 arcsec, showing high crystallinity. On the other hand, in Comparative example 3, a multilayer body was not produced because the raw materials did not melt unless the heat applied was higher than 1000° C. and the solvent volatilized at a temperature higher than 1000° C.

As described above, in each of Examples 1-13, the full width at half maximum of the rocking curve of the (002) plane of the β-$Ga_2O_3$ epitaxial layer obtained by the LPE method was 15-77 arcsec, showing extremely high crystalline.

REFERENCE SIGNS LIST

1 Upper heater
2 Middle heater
3 Lower heater
4 Substrate
5 Growing shaft (made of alumina)
6 Substrate holder
7 Platinum crucible
8 Melt in crucible
9 Crucible stand (made of mullite)
10 Thermocouple at the bottom of crucible
11 Furnace core tube (made of mullite)
12 Furnace lid (made of mullite)

The invention claimed is:

1. A method for producing a β-$Ga_2O_3$/β-$Ga_2O_3$ multilayer body, the method comprising mixing and melting $Ga_2O_3$ as a solute and PbO and $Bi_2O_3$ as solvents to form a resulting melt, then bringing a β-$Ga_2O_3$ substrate into direct contact with the resulting melt, and allowing a β-$Ga_2O_3$ single crystal to grow on the β-$Ga_2O_3$ substrate by liquid-phase epitaxial growth, thereby obtaining the β-$Ga_2O_3$/β-$Ga_2O_3$ multilayer body, wherein a mixing ratio of $Ga_2O_3$ as the solute and PbO and $Bi_2O_3$ as the solvents is solute: solvents=5-30 mol %: 95-70 mol %, and a mixing ratio of the solvents, PbO and $Bi_2O_3$, is PbO: $Bi_2O_3$=0.1-95 mol %: 99.9-5 mol %.

2. The method for producing a $\beta$-$Ga_2O_3$/$\beta$-$Ga_2O_3$ multilayer body according to claim 1, wherein a layer containing the $\beta$-$Ga_2O_3$ single crystal formed by the liquid-phase epitaxial growth comprises foreign elements in an amount of 0.01 mol % or more but 20 mol % or less.

3. The method for producing a $\beta$-$Ga_2O_3$/$\beta$-$Ga_2O_3$ multilayer body according to claim 2, wherein the foreign element is one or more selected from the group consisting of Be, Mg, Ca, Sr, Ba, Ti, Zr, Hf, Fe, Co, Ni, Cu, Zn, Cd, Al, In, Si, Ge, Sn, and Pb.

* * * * *